(12) United States Patent
Albert

(10) Patent No.: US 6,993,835 B2
(45) Date of Patent: Feb. 7, 2006

(54) METHOD FOR ELECTRICAL INTERCONNECTION OF ANGULARLY DISPOSED CONDUCTIVE PATTERNS

(75) Inventor: Douglas Marice Albert, Yorba Linda, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 117 days.

(21) Appl. No.: 10/726,888

(22) Filed: Dec. 4, 2003

(65) Prior Publication Data

US 2005/0121227 A1   Jun. 9, 2005

(51) Int. Cl.
*H05K 3/34* (2006.01)
(52) U.S. Cl. .............................. 29/840; 29/825; 29/832; 29/837; 29/839
(58) Field of Classification Search .................. 29/840, 29/832, 829, 825, 837, 839
See application file for complete search history.

(56) References Cited

U.S. PATENT DOCUMENTS

| | | | | |
|---|---|---|---|---|
| 3,024,151 A | * | 3/1962 | Robinson | 156/150 |
| 3,039,177 A | * | 6/1962 | Burdett | 29/848 |
| 3,427,715 A | * | 2/1969 | Mika | 29/832 |
| 3,971,127 A | * | 7/1976 | Giguere et al. | 29/827 |
| 4,495,546 A | * | 1/1985 | Nakamura et al. | 361/749 |
| 5,220,488 A | * | 6/1993 | Denes | 361/749 |
| 5,434,362 A | * | 7/1995 | Klosowiak et al. | 174/254 |
| 6,700,074 B2 | * | 3/2004 | Michel et al. | 174/260 |

* cited by examiner

*Primary Examiner*—Carl J. Arbes
(74) *Attorney, Agent, or Firm*—W. Eric Boyd

(57) ABSTRACT

A method for electrical interconnection of angularly disposed and abutted conductive patterns is disclosed along with a device created from the method. Conventional wire bonding equipment is used to apply a conductive metal ball at the junction of angularly disposed conductive patterns by orienting a cornerbond assembly whereby one or more conductive metal balls are orthogonally applied and electrically connected to the respective conductive patterns.

6 Claims, 4 Drawing Sheets

METHOD FOR ELECTRICAL INTERCONNECTION OF ANGULARLY DISPOSED CONDUCTIVE PATTERNS

CROSS REFERENCE TO RELATED APPLICATIONS

Not applicable

STATEMENT REGARDING FEDERALLY SPONSORED RESEARCH AND DEVELOPMENT

Not applicable

BACKGROUND OF THE INVENTION

The invention relates generally to the electrical interconnection of angularly disposed surfaces that each include one or more conductive patterns. Specifically, the invention relates to a simple and cost-effective method for interconnecting angularly disposed electrical contacts, also referred to herein as conductive patterns, such as the interconnection of a three-dimensional, multi-layer electronic module to a printed circuit board. The invention also claims a cornerbond assembly that incorporates the method.

There is a continuing demand for higher circuit density in a wide variety of electronic applications such as consumer electronics, space hardware, and military weaponry and hardware. To avoid the two-dimensional limitations of conventional printed circuit boards, industry has begun using high density, three-dimensional, multilayer modules comprised of individual interconnected layers of microelectronic circuitry which occupy very little surface area but provide greatly increased circuit density per given area.

Examples of such three-dimensional modules include those disclosed in U.S. Pat. No. 4,403,238, U.S. Pat. No. 4,525,921, U.S. Pat. No. 5,701,233, U.S. Pat. No. 4,617,160, and U.S. Pat. No. 6,072,234, all to common assignee, Irvine Sensors Corp., the assignee of the present application.

Another example of using the Z-axis to increase circuit density is the use of a daughterboard/motherboard configuration where one or more printed circuit boards are interconnected to a motherboard at a perpendicular angle.

Required input/output and power/ground interfaces between a multi-layer module or daughterboard and a printed circuit board are presently provided in different formats including ball grid array or wire bond interfaces. Each of these methods is undesirable due to the difficulty, time and expense associated with the design and assembly of such interfaces as well as problems with signal path length and related inductance.

Providing conductive contact pads on the surface of the multilayer module or daughterboard for interconnection with the printed circuit board is desirable due to ease of assembly, reworkability and shorter lead length. Unfortunately, there is presently no simple and efficient method for the interconnection of electronic assemblies with interconnection conductive patterns that lie in a perpendicular plane to each other.

It is therefore an object of the invention to provide a simple, cost-effective and reliable method for the electrical interconnection of perpendicular or angularly disposed conductive patterns using industry standard wire bonding equipment.

BRIEF SUMMARY OF THE INVENTION

The present invention discloses a method for the electrical interconnection of adjacent angularly disposed conductive patterns such as may exist where a multilayer module is to be interconnected to a printed circuit board to form a cornerbond assembly.

The illustrated embodiment of the invention comprises orienting selected conductive patterns with respect to the capillary of a conventional wire bonding machine whereby an electrically conductive ball is applied substantially at the interface, or junction, of the planes of the conductive patterns to be connected. Multiple balls are optionally applied along the junction for additional reliability or electrical current capacity. Where a gap at the intersection of the conductive patterns at the junction exists, multiple, stacked balls are applied at the junction to ensure an adequate interconnection exists.

While the claimed apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
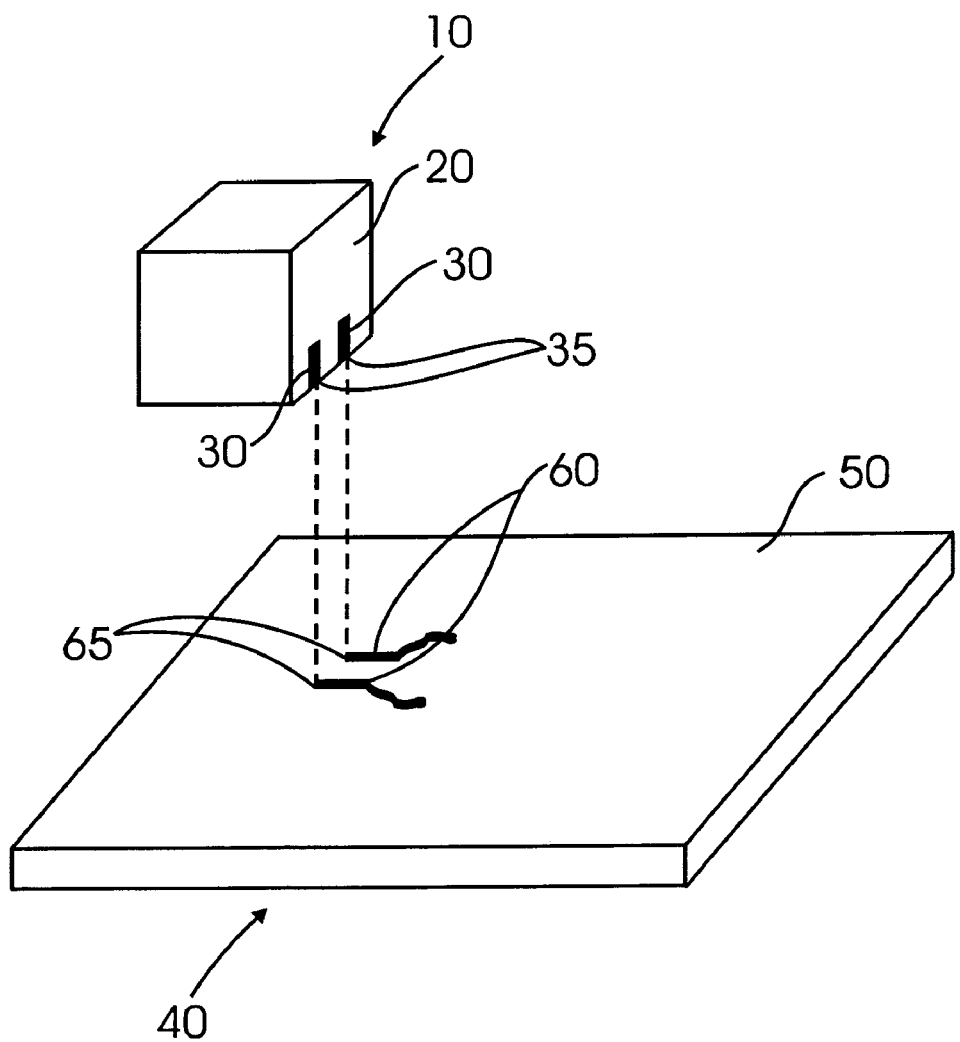
FIG. 1 is a perspective view of a first and second electronic assembly prior to being assembled into a cornerbond assembly showing conductive patterns.

Turning now to the figures wherein like numerals identify like elements among the several views, FIG. 1 shows a first electronic assembly 10 with a first surface 20. First surface 20 has a first conductive pattern 30 thereon, suitable for receiving a ball from a wire bonding machine. First conductive pattern 30 further includes a first terminal edge 35.

FIG. 1 also illustrates a second electronic assembly 40 with a second surface 50 and a second conductive pattern 60 thereon, suitable for receiving a ball from a wire bonding machine. Second conductive pattern 60 further includes a second terminal edge 65.

While the representative embodiment shown in FIG. 1 illustrates first electronic assembly 10 as a multilayer module and second electronic assembly 40 as a printed circuit board, it is expressly understood that the claimed invention is not limited to such structures and that the invention may be incorporated into any combination of electronic assemblies including combinations of individual electronic components, integrated circuit packages, multichip modules, bare integrated circuit die, monolithic components, or assemblies such as multilayer module-to-multilayer module, printed circuit board to flex cable and the like.

Further, while the representative embodiment shown in FIG. 1 illustrates a perpendicular orientation of first conductive pattern 30 with respect to second conductive pattern 60, the invention is not limited to such an orientation.

Figure 2:
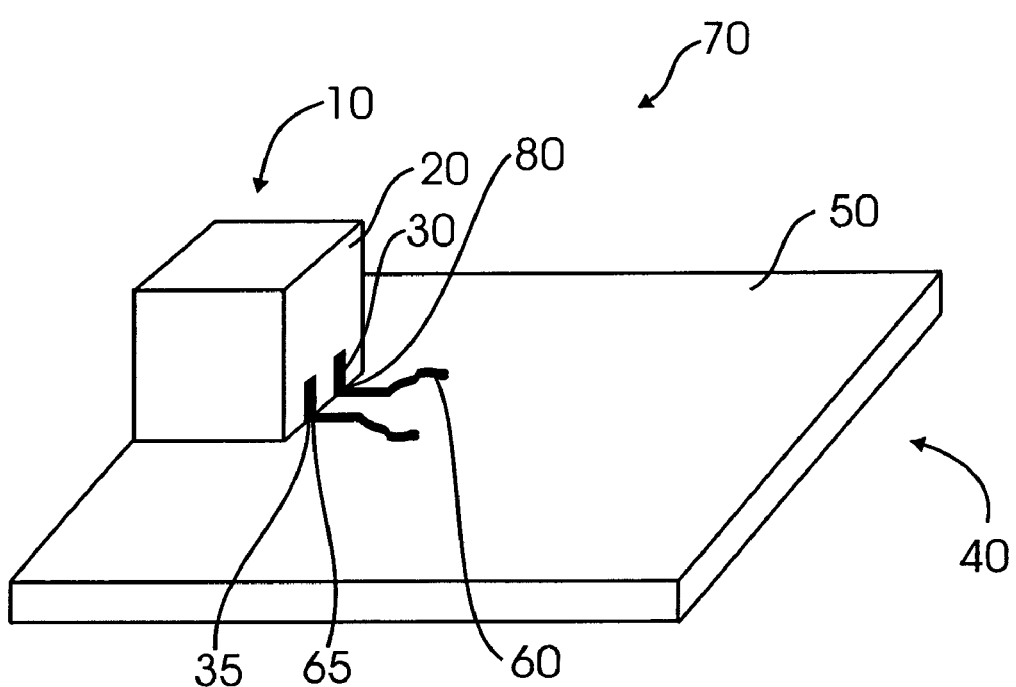
FIG. 2 is a perspective view of a first and second electronic assembly after being assembled into a cornerbond assembly showing conductive patterns.

As shown in FIG. 2, in the preferred embodiment, first electronic assembly 10 and second electronic assembly 40 are preferably fixedly interconnected to form a cornerbond assembly 70 whereby first terminal edge 35 is substantially registered with second terminal edge 65 to form a junction 80.

Figure 3:
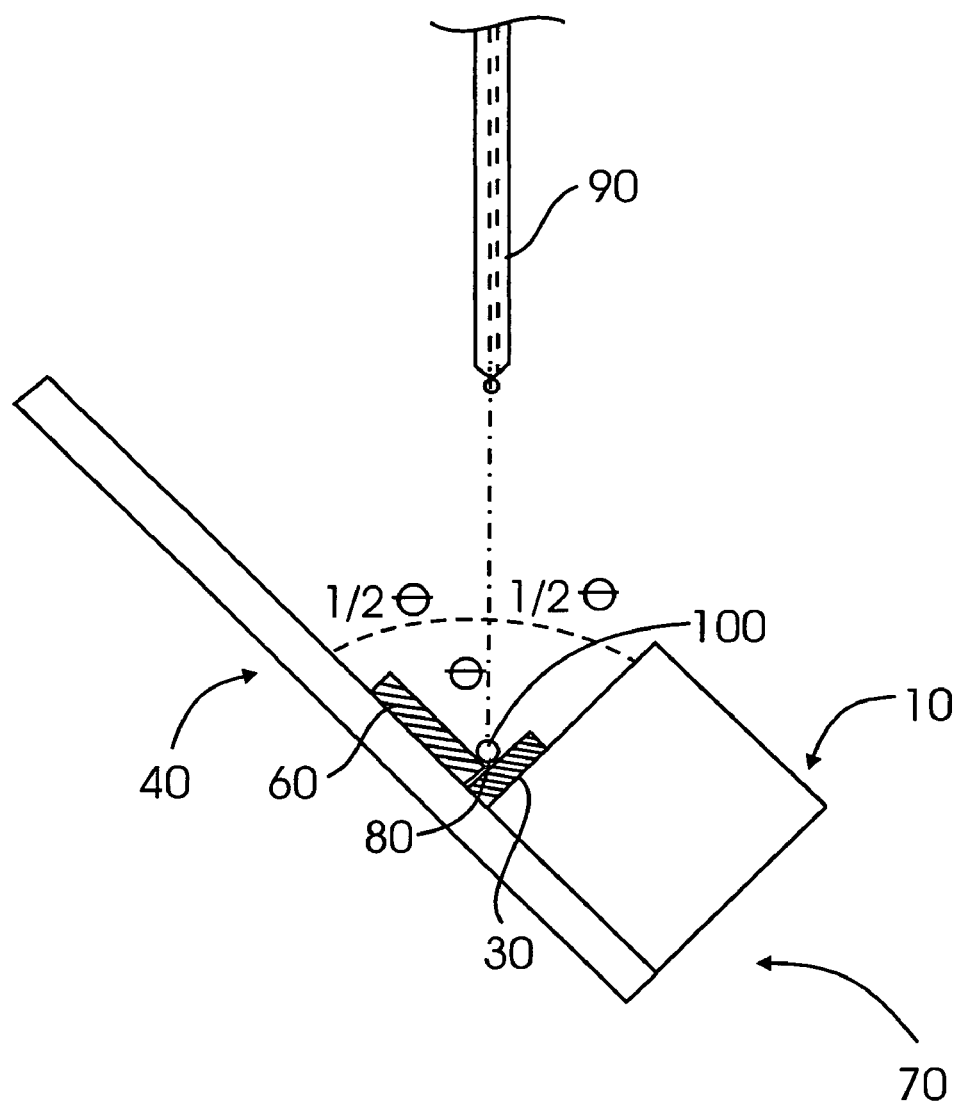
FIG. 3 is a cross-section of a cornerbond assembly with a conductive ball applied.

FIG. 3 illustrates the process step of orientation of cornerbond assembly 70 with respect to a capillary tube 90 of a conventional wire bond machine capable of applying a conductive ball such as is available from West Bond, Inc., so as to allow the application of a conductive ball at junction 80. The orientation of cornerbond assembly 70 is preferably such that the capillary force is applied along a path that is one-half of the angle between first surface 20 and second surface 50. For example, if first surface 20 and second surface 50 lie at a 90 degree angle to each other, cornerbond assembly 70 is preferably oriented so that first surface 20 and second surface 50 lie at a 45 degree angle with respect the travel path of capillary tube 90.

As further seen in FIG. 3, at least one conductive metal ball 100 is applied at junction 80 so that an electrical interconnection is formed between conductive ball 100, first conductive pattern 30 and second conductive pattern 60, as is well known in the wire bonding art. Conductive ball 100 is preferably a gold material such as gold or gold palladium.

When cornerbond assembly 70 is properly oriented with respect to the travel path of capillary tube 90 as provided above, the thermosonic, orthogonal forces generated on the respective conductive patterns by and through conductive ball 100 via capillary tube 90 are substantially equal, resulting in a reliable electrical connection.

Depending on the width of the respective conductive patterns, multiple conductive balls 100 may be applied along the length of junction 80 to create a reliable interconnection capable of improved electrical current handling.

Figure 4:
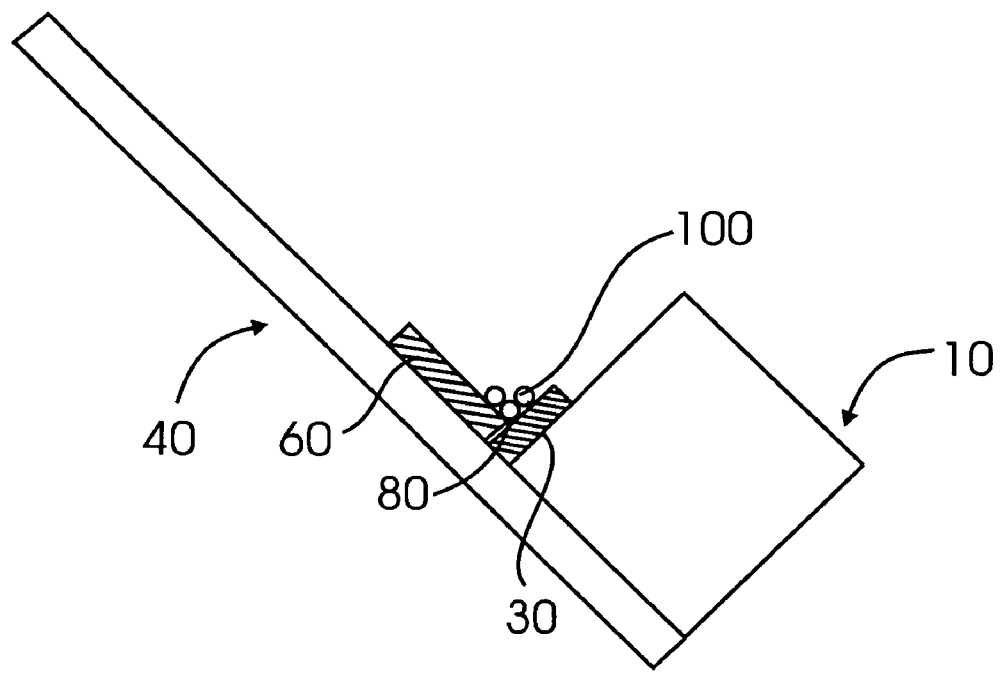
FIG. 4 is a cross-section of a cornerbond assembly with multiple, stacked conductive balls applied to overcome a terminal edge abutment gap.

In situations where terminal edge abutment gaps exist at junction 80, multiple conductive balls are conveniently applied to create an electrical interconnection between electronic assemblies as seen in FIG. 4. Multiple balls are accurately placed in the junction by proper orientation of the cornerbond assembly with respect to the capillary tube before each ball is affixed.

Additionally, the claims below are expressly intended to encompass structures where conductive patterns exist on more than one plane such as where conductive patterns exist on multiple surfaces of a multilayer module or on two sides of a daughterboard.

Optionally, the junction may be encapsulated after ball placement with a suitable encapsulant or underfill such as HYSOL® 4531 available from LOCTITE® to enhance the mechanical integrity of the connection.

Many alterations and modifications may be made by those having ordinary skill in the art without departing from the spirit and scope of the invention. Therefore, it must be understood that the illustrated embodiment has been set forth only for the purpose of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed even when not initially claimed in such combinations.

The words used in this specification to describe the invention and its various embodiments are to be understood not only in the sense of their commonly defined meanings, but to include by special definition in this specification, structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are therefore defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and ever initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious subsitutions now or later known to one with ordinary skill in the art are defined to be within the scope of the defined elements.

The claims are thus to be understood to include what is specifically illustrated and described above, what is conceptually equivalent, what can be obviously subsituted and also what essentially incorporates the essential idea of the invention.

I claim:

1. A method for interconnecting a plurality of electronic assemblies to form a cornerbond assembly comprised of:
providing a first electronic assembly with a first surface, said first surface including a conductive pattern thereon, said conductive pattern including a first terminal edge,
providing a second electronic assembly with a second surface, said second surface including a conductive pattern thereon, said conductive pattern including a second terminal edge,
orienting said first electronic assembly with respect to said second electronic assembly whereby said first surface is angularly disposed to said second surface and said first terminal edge and said second terminal edge are substantially registered to form a junction, fixedly applying at least one wire ball to said junction whereby said first conductive pattern is electrically interconnected to said second conductive pattern.

2. The method of claim 1 wherein said first electronic assembly includes a three dimensional, multi-layer electronic module and said second electronic assembly includes a printed circuit board.

3. The method of claim 1 wherein said first surface and said second surface are angularly disposed at an angle of about 90 degrees.

4. The method of claim 1 wherein said first surface and said second surface are angularly disposed at an angle greater than 90 degrees.

5. The method of claim 1 wherein said first surface and said second surface are angularly disposed at an angle less than 90 degrees.

6. The method of claim 1 further comprising the step of encapsulating said junction after said at least one wire ball has been fixedly applied.

* * * * *